United States Patent
Nikolayenkov et al.

(10) Patent No.: US 11,888,238 B2
(45) Date of Patent: Jan. 30, 2024

(54) LINEAR IMPEDANCE COMPENSATION SYSTEM WITH MICROSTRIP AND SLOTLINE COUPLING AND CONTROLLABLE CAPACITANCE

(71) Applicant: NXP USA, Inc., Austin, TX (US)

(72) Inventors: Oleksandr Nikolayenkov, Toulouse (FR); Geoffrey Tucker, Tempe, AZ (US); Martin Beuttner, Toulouse (FR)

(73) Assignee: NXP USA, Inc., Austin, TX (US)

( * ) Notice: Subject to any disclaimer, the term of this patent is extended or adjusted under 35 U.S.C. 154(b) by 130 days.

(21) Appl. No.: 17/408,655

(22) Filed: Aug. 23, 2021

(65) Prior Publication Data
US 2021/0384627 A1 Dec. 9, 2021

Related U.S. Application Data

(63) Continuation of application No. 16/838,671, filed on Apr. 2, 2020, now Pat. No. 11,322,844.

(30) Foreign Application Priority Data

Apr. 23, 2019 (EP) .................................. 19305519
May 14, 2021 (EP) .................................. 21305637

(51) Int. Cl.
*H01Q 5/335* (2015.01)
*H01P 3/02* (2006.01)
(Continued)

(52) U.S. Cl.
CPC ............. *H01Q 5/335* (2015.01); *H01P 3/023* (2013.01); *H01P 3/081* (2013.01); *H01Q 23/00* (2013.01)

(58) Field of Classification Search
CPC ........ H01Q 5/335; H01Q 23/00; H01P 3/023; H01P 3/081; H01P 5/04; H01L 23/642;
(Continued)

(56) References Cited

U.S. PATENT DOCUMENTS

| 4,533,886 A | 8/1985 | Cornish et al. |
| 4,636,757 A | 1/1987 | Harrison et al. |

(Continued)

FOREIGN PATENT DOCUMENTS

EP 2416494 A2 2/2012

OTHER PUBLICATIONS

Notice of Allowance for U.S. Appl. No. 16/838,671, dated Jan. 31, 2022.
(Continued)

*Primary Examiner* — Andrea Lindgren Baltzell
*Assistant Examiner* — Kimberly E Glenn

(57) ABSTRACT

Embodiments of a circuit, system, and method are disclosed. In an embodiment, a circuit includes first and second microstrip transmission lines. The first and second microstrip transmission lines include linearly arranged conductive strips on the circuit and a slotline formation extends between the first microstrip transmission line and the second microstrip transmission line so that the slotline formation is configured to electromagnetically couple the first microstrip transmission line to the second microstrip transmission line during operation of the circuit. In addition, the circuit includes at least one controllable capacitance circuit electrically connected to at least one of the first microstrip transmission line and the second microstrip transmission line, where a magnitude of a capacitance value of the at least one controllable capacitance circuit (e.g., including a barium strontium titanate (BST) capacitor) is controllable (e.g., in response to a capacitance control signal received at a control interface).

17 Claims, 15 Drawing Sheets

(51) Int. Cl.
*H01P 3/08* (2006.01)
*H01Q 23/00* (2006.01)

(58) Field of Classification Search
CPC ............ H01L 2223/6677; H01L 23/66; H04B 1/0458; H04B 1/18; H04B 1/48; H04B 1/40; H04B 1/04; H04B 2001/0408; H03H 7/383
See application file for complete search history.

(56) References Cited

U.S. PATENT DOCUMENTS

| | | | |
|---|---|---|---|
| 5,075,647 | A | 12/1991 | Petter |
| 8,675,337 | B2 * | 3/2014 | Baniecki .................. H01G 7/06 333/174 |
| 9,130,534 | B2 | 9/2015 | Schmidhammer et al. |
| 9,484,611 | B2 * | 11/2016 | Forstmaier .............. H01P 3/026 |
| 9,755,576 | B2 | 9/2017 | Perreault et al. |
| 2012/0295554 | A1 | 11/2012 | Greene et al. |
| 2014/0028521 | A1 | 1/2014 | Bauder et al. |
| 2019/0115875 | A1 | 4/2019 | Nikovayenkov et al. |
| 2020/0343636 | A1 | 10/2020 | Nikolayenkov et al. |

OTHER PUBLICATIONS

Caspers, F.; "RF Engineering basic concepts: S-paramenters"; Cornell University, contribution to the CAS-CERN Accelerator School: Specialised Course on RF for Accelerators, Ebeltoft, Denmark; retrieved from the Internet https://arxiv.org/abs/1201.2346 ; 27 pages (Jun. 8-17, 2010).

Zinieris, M.M. et al; ResearchGate; "A Broadband Microstrip-to-Slot-Line Transition", Microwave and Optical Technology Letters, vol. 18, Issue 5, Aug. 5, 1998, pp. 339-342.

Malmqvist, R. et al; "RF MEMS and MMIC based Reconfigurable Matching Networks for Adaptive Multi-Band RF Front-Ends"; IEEE International Microwave Workshop on RF Front-ends for Software Defined and Cognitive Radio Solutions (IMWS), Aveiro, Portugal; 4 pages (Feb. 22-23, 2010).

Knorr, Jeffrey B; "Slot-Line Transitions (Short Papers)"; IEEE Transactions on Microwave Theory and Techniques, vol. 22, No. 5; 7 pages (1974).

Seman, Norhudah et al; "Microstrip-Slot Transition and Its Applications in Multilayer Microwave Circuits"; Passive Microwave Components and Antennas; 21 pages (2010).

Wang, Y. et al; "Double Microstrip-Slot Transitions for Broadband 90 degree Microstrip Phase Shifters"; IEEE Microwave and Wireless Components Letters, vol. 22, No. 2; pp. 58-60 (Jan. 27, 2012).

Cavendish Kinetics; "SmarTune Antenna Tuner—32CK417R, V2.4"; retrieved from the Internet www.cavendish-kinetics.com; 11 pages (2017).

U.S. Appl. No. 17/107,339, filed Nov. 30, 2020, 31 pages.

Non-Final Office Action for U.S. Appl. No. 16/838,671 dated Oct. 5, 2021.

* cited by examiner

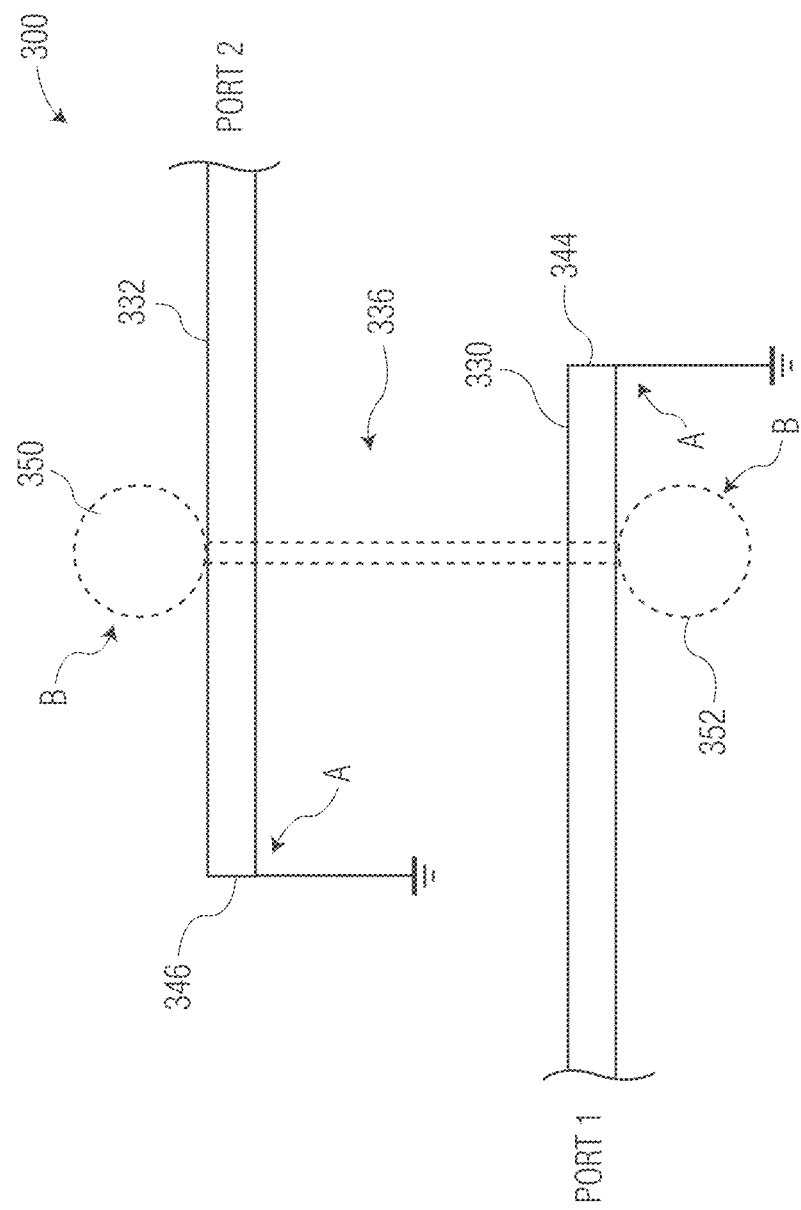

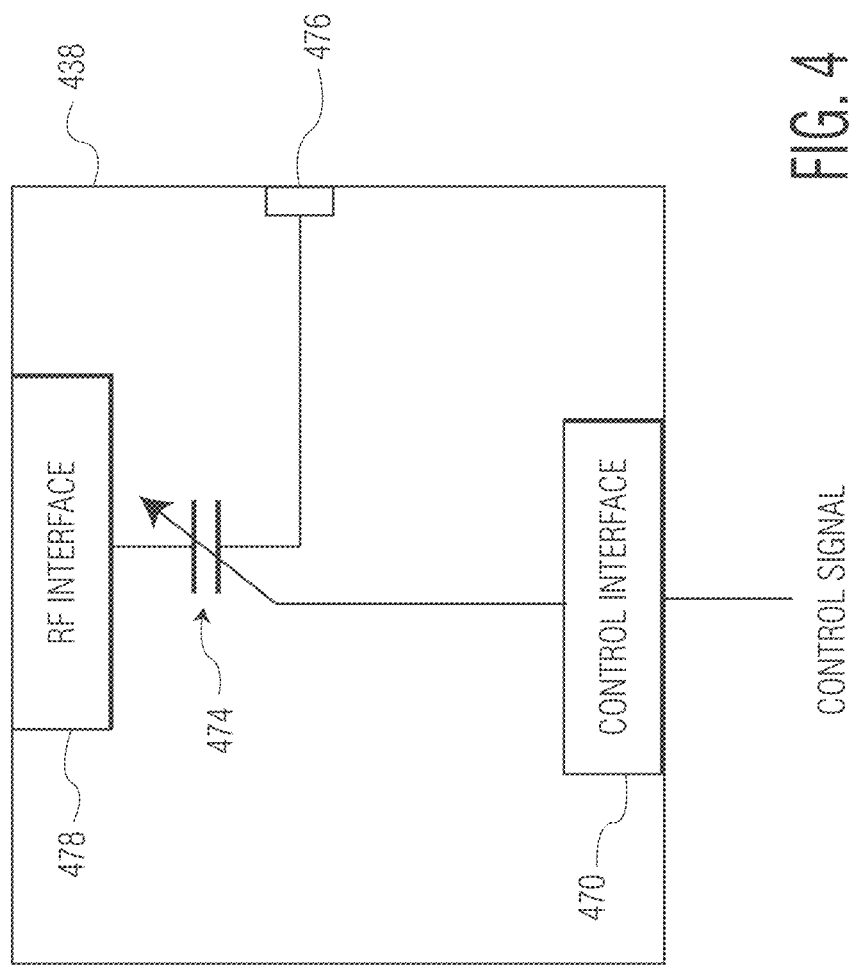

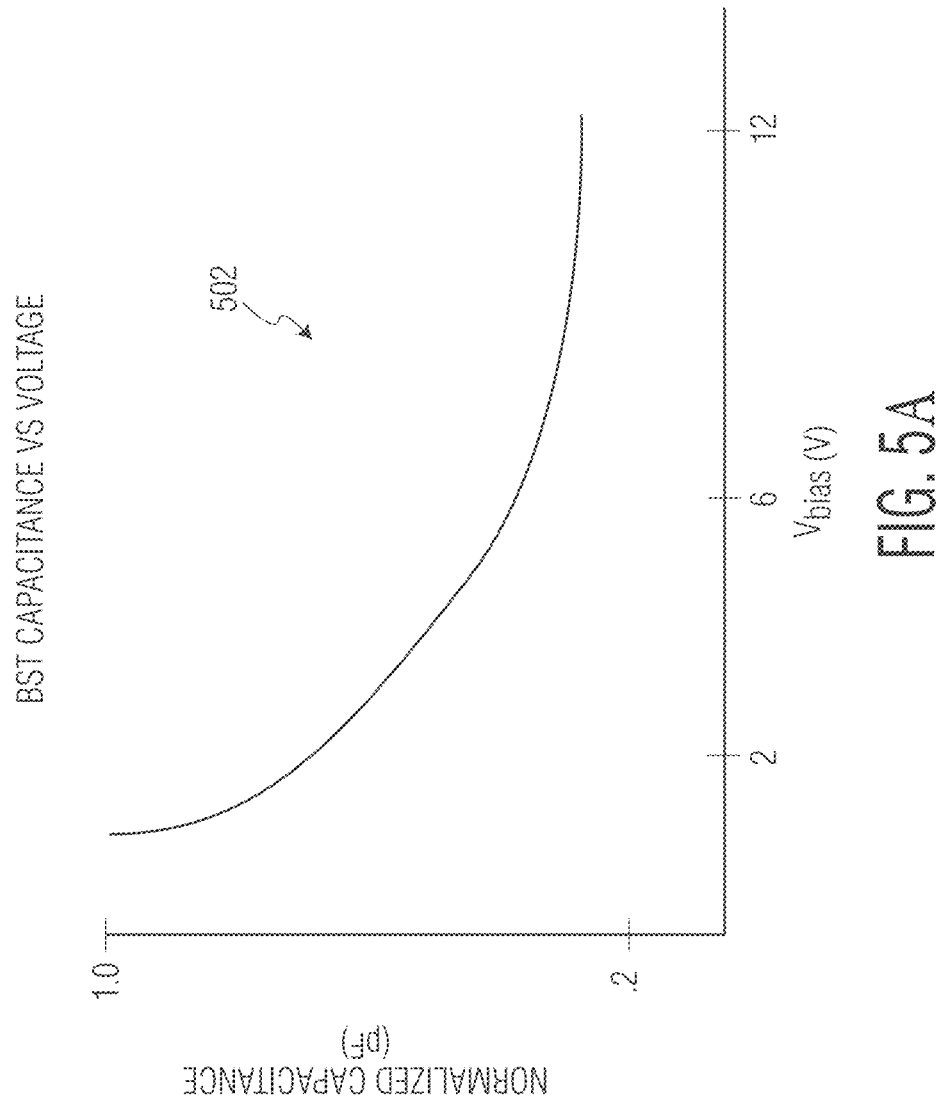

LINEAR IMPEDANCE COMPENSATION SYSTEM WITH MICROSTRIP AND SLOTLINE COUPLING AND CONTROLLABLE CAPACITANCE

RELATED APPLICATION

This disclosure claims priority to EPO 21305637.7 titled "Linear Impedance Compensation System with Microstrip and Slotline Coupling and Controllable Capacitance" filed May 14, 2021 and is a continuation-in-part of application Ser. No. 16/838,671 titled "Impedance Compensation System Using Microstrip and Slotline Coupling and Controllable Capacitance" filed Apr. 2, 2020 which claims priority to EPO 19305519.1 titled "Impedance Compensation System Using Microstrip and Slotline Coupling and Controllable Capacitance" filed Apr. 23, 2019, the contents each of which are herein incorporated by reference in its entirety.

BACKGROUND

A base transceiver station (BTS) uses beamforming to transmit a beam in a specific direction. The specific direction is controlled by manipulating one or more of phase shift and amplitude of radio frequency (RF) signals that defines the beam. Further, the BTS receives RF signals. Each RF signal of the RF signals is transmitted or received by a respective RF front-end which includes an antenna. Impedance matching is a process of compensating for mismatch of antenna impedance and impedance of other RF components in the RF front-end. Without impedance matching, performance of the RF front-end degrades due to non-optimal load conditions, specifically that of the antenna. Various techniques are used to manage impedance mismatch including, for example, adding an impedance compensation system between the antenna and the other RF components in the RF front-end to reduce the mismatch, improve power transfer by the power amplifier and reduce signal reflections. Such impedance compensation systems are typically implemented with 7C and T-structures that are based on sections of variable reactance connected to a transmission line of the RF front-end to generate resonant circuitry. These implementations typically rely on bulky components which tend to be highly lossy and do not scale well at higher powers.

BRIEF DESCRIPTION OF THE DRAWINGS

FIG. 3A depicts the first microstrip transmission line, the second microstrip transmission line, and the slotline formation as shown in FIG. 2.

FIG. 4 depicts an embodiment of a controllable capacitor circuit.

FIGS. 5A to 5C illustrates that use of a barium strontium titanate (BST) capacitor in the impedance compensation system results in a linearity of the impedance compensation system.

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", "an example", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
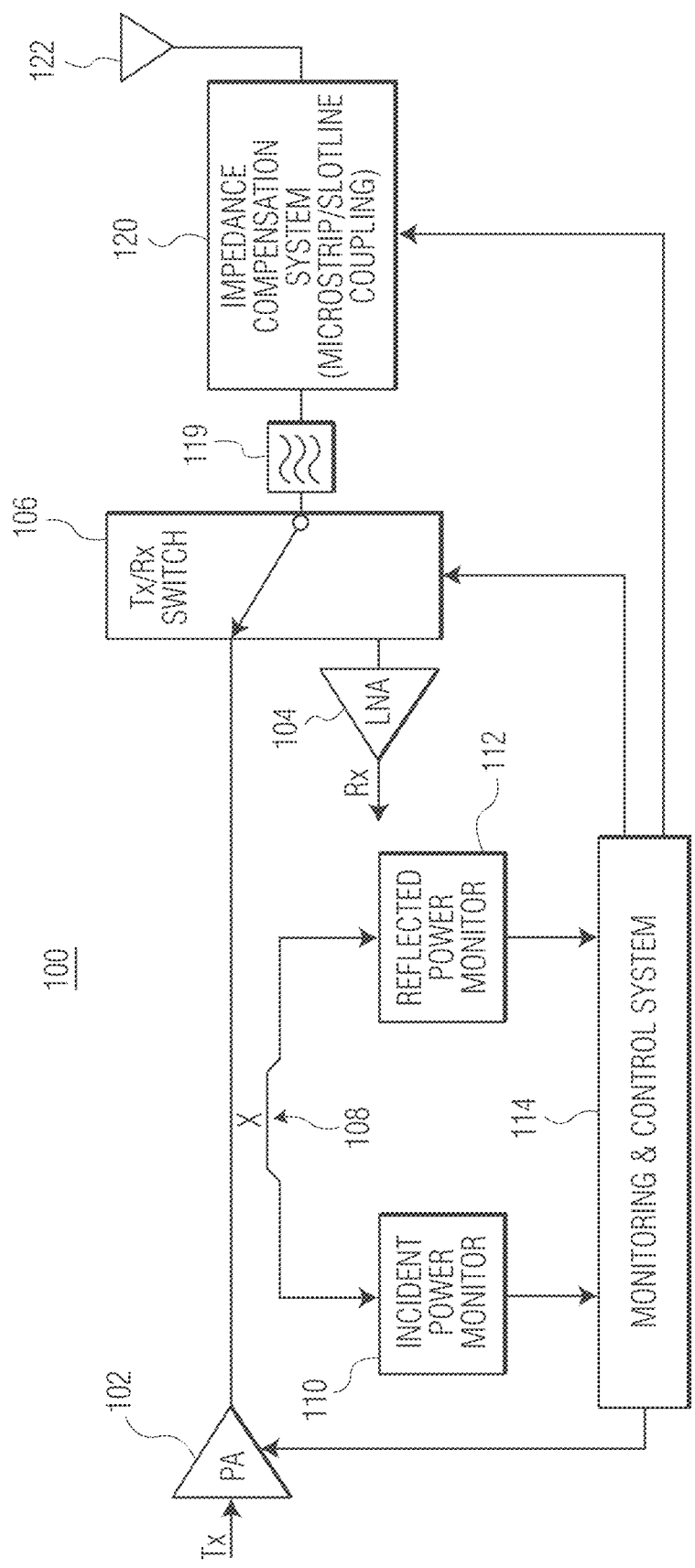
FIG. 1 is a block diagram of an example RF front-end that includes an impedance compensation system.

FIG. 1 is a block diagram of an example radio frequency (RF) front-end 100 that includes a transmit signal power amplifier (PA) 102, a receive signal low noise amplifier (LNA) 104, a transmitter/receiver switch (Tx/Rx switch) 106, a directional coupler 108, an incident power monitor 110, a reflected power monitor 112, a monitoring and control system 114, a bandpass filter 119, an impedance compensation system 120, and a load in the form of an antenna 122. In a transmit operation, the Tx/Rx switch is set to a transmit state (as shown in FIG. 1) and an RF signal in the form of a transmit signal (Tx) is passed to the power amplifier 102, through the directional coupler 108, through the Tx/Rx switch 106, through the bandpass filter 119 which reduces or suppresses certain frequency ranges in the Tx signal outside a transmit frequency range, through the impedance compensation system 120, and to the antenna 122 for transmission. The transmit frequency range is an RF frequency range over which the RF front-end 100 is to transmit RF signals. In a receive operation, the Tx/Rx switch 106 would be set to a receive state (not shown in FIG. 1) and an RF signal in the form of a receive signal (Rx) would be passed from the antenna 122, through the impedance compensation system 120, though the bandpass filter 119 which reduces or suppresses certain frequency ranges in the Rx signal outside a receive frequency range, through the Tx/Rx switch 106, and to the low noise amplifier 104. The receive frequency range is an RF frequency range over which the RF front-end 100 is to receive RF signals. During transmit operation, incident power and reflected power can be monitored by the incident power monitor 110 and by the reflected power monitor 112, respectively, via the directional coupler 108. The monitoring and control system 114 can control aspects of the power amplifier 102, the Tx/Rx switch 106, and the impedance compensation system 120 through control signals and may control the impedance compensation system 120 in response to power information from the incident power monitor 110 and/or power information from the reflected power monitor 112. In an embodiment and as is described in more detail below, the monitoring and control system 114 provides a capacitance control signal to the impedance compensation system 120 which uses microstrip and slotline coupling and a controllable capacitor circuit to compensate for mismatch between impedance of the antenna 120 and impedance of other components of the RF front-end 100 (referred to as "impedance mismatch"). In an embodiment, the impedance of the antenna 122 is matched with the impedance of the other components of the RF front end module 100 by the impedance compensation system 120. Further, a plurality of RF front-ends 100 may be combined to form a beamforming antenna array and RF signals transmitted by each RF front-end may constructively add or destructively add to perform a beamforming of a beam transmitted by the antenna array.

Figure 2:
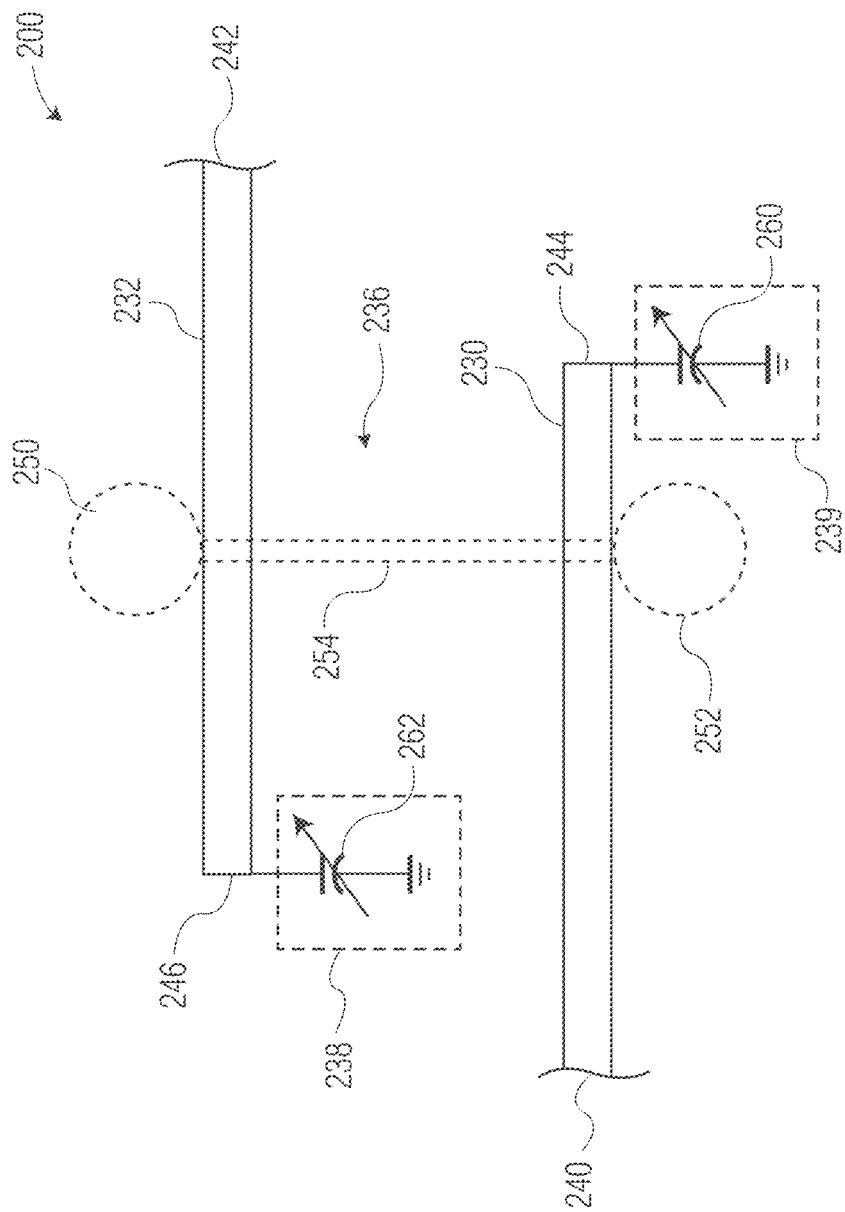
FIG. 2 depicts a circuit of the impedance compensation system that can be used in the RF front-end of FIG. 1 to provide compensation for impedance mismatch.

FIG. 2 depicts a circuit 200 (e.g., impedance compensation system 120, FIG. 1) that can be used in, for example, an RF front-end 100 to provide compensation for the impedance mismatch. The circuit includes a first microstrip transmission line 230, a second microstrip transmission line 232, a slotline formation 236, and one or more controllable capacitance circuits 238, 239 which are electrically connected to the first and second microstrip transmission lines. In an embodiment, the first and second microstrip transmission lines depicted in FIG. 2 are each linear microstrip transmission lines of conductive material formed on a multilayer substrate (not shown) arranged in parallel to each other. The multilayer substrate may include a printed circuit board (PCB) with multiple patterned conductive layers and one or more dielectric layers. The first and second microstrip transmission lines both may be formed in a first patterned conductive layer of the PCB, or the first and second microstrip transmission lines may be formed in two different patterned conductive layers of the PCB (e.g., one layer above the slotline formation 236, and another layer below the slotline formation 236) in various embodiments. The first microstrip transmission line 230 includes an open stub 244 (i.e., one end of the first microstrip transmission line which terminates energy travel), and the second microstrip transmission line 232 includes an open stub 246 (i.e., one end of the second microstrip transmission line which terminates energy travel). In an embodiment, the open stubs 244 and 246 are open circuited stubs not connected to a ground or reference potential as is known in the field compared to short circuited stubs which are connected to a ground or reference potential.

The slotline formation 236 is formed in a patterned conductive layer of the PCB (referred to below as a "conductive slotline layer") that is different from the layer(s) in which the first and second microstrip transmission lines are formed. In an embodiment, one or more dielectric layers may be positioned between the layer(s) with the microstrips 230, 232 and the layer with the slotline formation 236. The slotline formation 236 includes two circular shaped shorted stubs 250 and 252 connected by an elongated linear portion 254. In an embodiment, the shorted stub 250 and the shorted stub 252 are short circuited stubs as is known in the field. In an embodiment, the elongated linear portion 254 is arranged perpendicular to the first and second microstrip transmission lines and as shown in FIG. 2, from an overhead view perspective, the first microstrip transmission line 230 electromagnetically intersects (i.e., passes over without a direct electrical connection) a first portion of the slotline formation of the first microstrip transmission line and the second microstrip transmission line 232 electromagnetically intersects (i.e., passes over without a direct electrical connection) a second portion of the slotline formation 236.

As used herein, the term "gap" means a removed portion of a patterned, planar conductive layer. In an embodiment, the slotline formation 236 includes an elongated, substantially-linear gap (i.e., elongated linear portion 254) formed within the conductive slotline layer such as a first conductive layer of a PCB (e.g., a conductive ground layer). For example, the slotline formation 236 includes a linear gap portion extending between a first rounded end gap portion (or simply rounded end or stub 250) and a second rounded end gap portion (or simply rounded end or stub 252), and is formed as a region between a first interior sidewall of the first conductive layer (i.e., the conductive slotline layer), a second interior sidewall of the first conductive layer, a first rounded interior endwall of the first conductive layer, and a second rounded interior endwall of the first conductive layer. For example, the electrical lengths of a circumference of the shorted stubs 250 and 252 may be about one-quarter of a wavelength of a carrier frequency of the RF signal provided by/generated by the transmit signal power amplifier (see FIG. 1) during operation, or one-quarter of a wavelength of a fundamental operational frequency of the power amplifier. A length of the elongated linear portion 254 may be based on a physical separation of the first and second micro strip lines and a longer linear portion 254 results in more signal losses. In various embodiments, the fundamental operational frequency of the power amplifier is in a range of about 800 megahertz (MHz) to about 10 gigahertz (GHz), although the fundamental operational frequency may be lower or higher, as well. In other embodiments, the slotline formation 236 can have other lengths or characteristics.

With reference to FIG. 2, the first microstrip transmission line 230 at end 240 is electrically connected to, for example, other front-end components of an RF front-end, e.g., band pass filter (BPF) 119, the Tx/Rx switch 106 and amplifiers 102 and 104 as shown in FIG. 1, and the second microstrip transmission line 232 is electrically connected to, for example, the antenna 122 as shown in FIG. 1 at end 242. Each of the ends 244 and 246 of the first and second microstrip transmission lines are electrically connected (e.g., via conductive metal) to a respective controllable capacitance circuit 238. Although the shorted stubs 250 and 252 of the slotline formation are circular shaped in the example of FIG. 2, other shapes of the shorted stubs and/or the slotline formation in general are possible. Additionally, although the slotline formation is shown as being symmetric (e.g., in that the shorted stubs 250, 252 are the same shape and size), the slotline formation may not be symmetric.

Although it may not be apparent from the overhead view of FIG. 2, the first and second microstrip transmission lines 230 and 232 are physically (and galvanically) separated from the slotline formation 236 (e.g., in a vertical direction, that is, in a direction perpendicular to the plane of the drawing sheet) by a dielectric material. Because the microstrip transmission lines are physically separated from the slotline formation by a dielectric material, there is no direct electrical connection (i.e., coupling by which electrical current can be communicated via a conductive material such as metal) between either of the first or second microstrip transmission lines and the slotline formation. Nevertheless, the first and second microstrip transmission lines are electromagnetically coupled to the slotline formation, e.g., through inductive coupling, and accordingly the microstrip transmission lines are electromagnetically coupled to one another through the slotline formation. For example, with regard to the RF energy in transmission (e.g., from the first microstrip transmission line to the second microstrip transmission line), the RF energy encounters a microstrip-to-slotline transition that involves electromagnetic coupling in the area of overlap of the first microstrip transmission line 230 and a first end of the elongated linear portion 254, and then a slotline-to-microstrip transition that also involves electromagnetic coupling in the area of overlap of the second micro strip transmission line 232 and the second end of the elongated linear portion 254.

In an embodiment, each controllable capacitance circuit 238, 239 include a respective variable capacitor that is electrically connected to one of the open stubs of the microstrip transmission line, e.g., electrically connected via direct physical contact. For example, a first variable capacitor 260 is electrically connected to the open stub 244 of the first microstrip transmission line 230 and a second variable capacitor 262 is electrically connected to the open stub 246 of second first microstrip transmission line 232. Although in the example of FIG. 2, a controllable capacitance circuit 238 is electrically connected to both the first and second microstrip transmission lines, in other embodiments, at least one of the microstrip transmission lines may not be electrically connected to a controllable capacitor circuit 238. In a case in which at least one of the microstrip transmission lines is not electrically connected to a controllable capacitor circuit 238, open stub impedance of the microstrip at the intersection point with the slotline should be at or near zero and shorted stub impedance of the slotline at the intersection point with the microstrip should approach infinite to achieve a minimum insertion loss of the impedance compensation system 120. The impedance of an open stub microstrip with physical length of the microstrip line approximately equal to one quarter of a wavelength of the RF signal is about zero, in an embodiment. Thus, having a controllable capacitance circuit 238 connected to each open stub microstrip may provide a desired low impedance at the intersection point with a physical microstrip length that is much shorter than if no capacitor were attached.

In operation, each controllable capacitance circuit 238, 239 is controlled and/or adjusted by a respective capacitance control signal that is received from, for example, a monitoring and control system (see FIG. 1, monitoring and control system 114). For example, the capacitance control signal is generated by the monitoring and control system 114 in response to monitored incident power 110 and/or in response to monitored reflected power 112 and the capacitance control signal is dynamically adjusted to compensate for impedance mismatch. In an embodiment, the monitoring and control system 114 is configured to implement an optimization algorithm to attempt to achieve maximum incident power or minimum reflected power. For example, a power amplifier (see FIG. 1, PA 102) supplies maximum power to the antenna (see FIG. 1, antenna 122) only when the impedance of the antenna 122 is matched to other components of the example RF front-end 100, e.g., when there is minimum reflection from the antenna load (Γ=0 at antenna). When the impedances are mismatched (e.g., Γ=0.2), incident power will drop, and the capacitance of each controllable capacitance circuit 238, 239 is adjusted to recover the incident power until mismatch is compensated to provide Γ→0 at the power amplifier's output. In operation, the power amplifier 102 desirably generates maximum power, and the full generated power will be delivered to the antenna 122 as a result of the impedance compensation system 120 compensating for the mismatch.

As described above, the capacitance values of the variable capacitors 260, 262 is controlled to compensate for the mismatch. A description of some design and operational theory is provided below with reference to FIGS. 3A-3C.

Figure 3B:
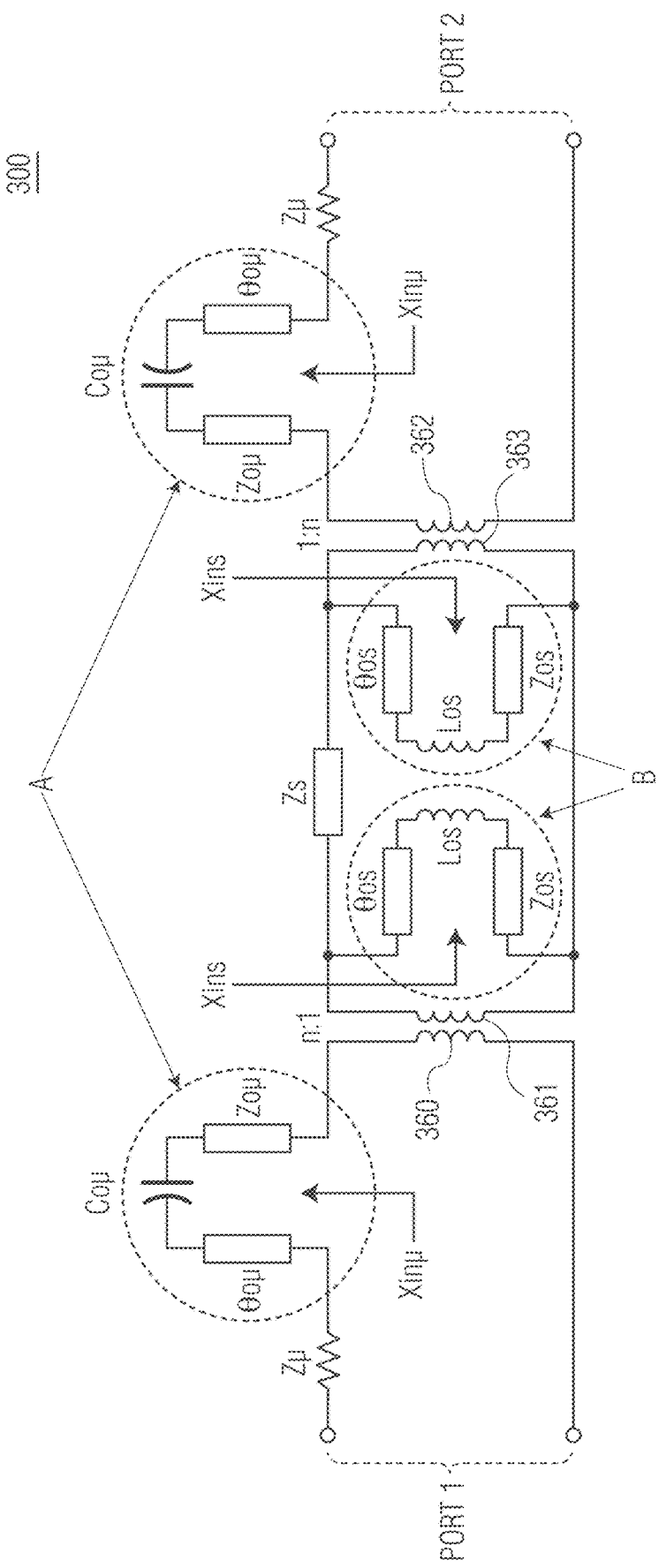
FIG. 3B is an example of an equivalent circuit of components shown in FIG. 3A.

FIG. 3A depicts the first microstrip transmission line 330, the second microstrip transmission line 332, and the slotline formation 336 as shown in FIG. 2, and FIG. 3B is an example of an equivalent circuit 300 of the components shown in FIG. 3A. In FIGS. 3A and 3B, an interface to the first microstrip transmission line is identified as "Port 1" and an interface to the second microstrip transmission line is identified as "Port 2." Components of the equivalent circuit shown in FIG. 3B include:

Zµ—microstrip transmission line characteristic impedance;
Zoµ—microstrip transmission line stub characteristic impedance;
θoµ—microstrip transmission line stub electrical length;
Coµ—microstrip transmission line stub capacitance;
Zs—slotline formation characteristic impedance;
Zos—slotline formation stub characteristic impedance.
θos—slotline formation stub electrical length;
Los—slotline formation stub inductance; and
n—transformer turns ratio, which represents the coupling magnitude between the microstrip transmission line and the slotline formation.

Figure 3C:
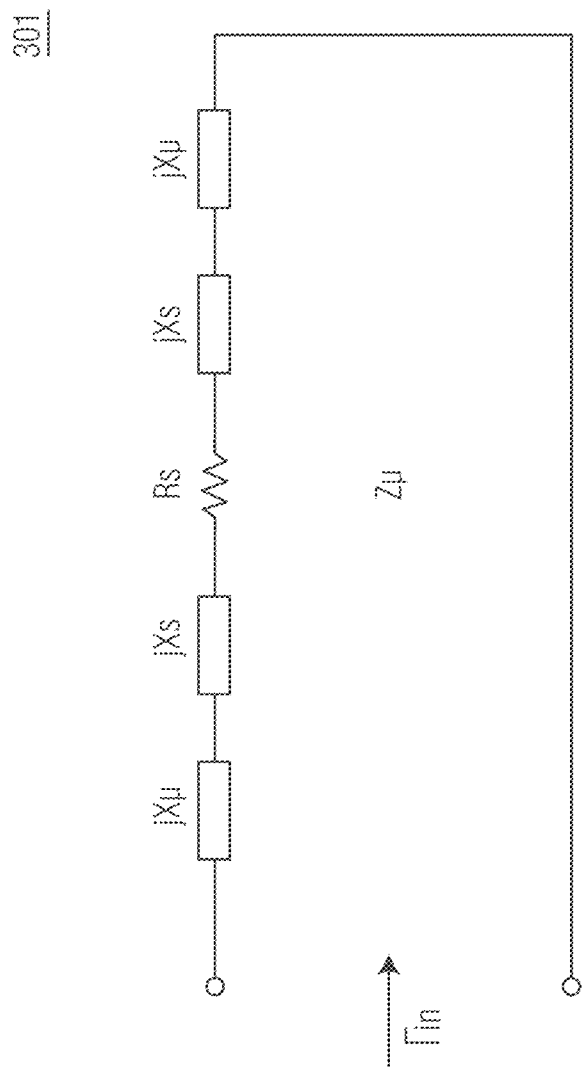
FIG. 3C is an equivalent circuit of the equivalent circuit of FIG. 3B transformed to the Port 1 side.

In the equivalent circuit 300 shown in FIG. 3B, inductive coupling at the first microstrip transmission line-to-slotline formation transition is represented by the transformer formed by winding inductances 360 and 361 (n:1 coupling), and inductive coupling at the slotline formation-to-second microstrip transmission line transition is represented by the transformer formed by inductors 362 and 363 (1:n coupling). The equivalent circuit elements identified within the dashed circles "A" and corresponding to the microstrip transmission line open stubs 344 and 346 include Zoµ, θoµ, and Coµ and the equivalent circuit elements identified within the dashed circles "B" and corresponding to the slotline formation shorted stubs 350 and 352 include Zos, θos, and Los. Using the equivalent circuit and transforming the circuit's components to the Port 1 side (e.g., first microstrip transmission line), an equivalent circuit 301 as shown in FIG. 3C is derived, where:

$$Rs = \frac{n^2 Zs Xins}{Zs^2 + Xins} \quad (1)$$

$$Xs = \frac{n Zs Xins}{Zs^2 + Xins} \quad (2)$$

$$X\mu = Xin\mu \quad (3)$$

In FIG. 3C, the "j" represents the imaginary part of the transmission line complex characteristic impedance. Thus, "jXµ" is the imaginary part of the microstrip transmission line characteristic impedance and "jXs" is the imaginary part of slotline formation characteristic impedance.

If both microstrip transmission line open stubs 344 and 346 are identical and both slotline formation shorted stubs 350 and 352 are identical, the input reflection coefficient, Γin, can be expressed as:

$$\Gamma in = \frac{Rs - Z\mu - j2(X\mu + Xs)}{Rs + Z\mu + j2(X\mu + Xs)} \quad (4)$$

and $$n = \frac{Xin\mu}{Xins} \quad (5)$$

where n is ratio of microstrip line characteristic impedance to slotline characteristic impedance at an intersect point.

Therefore, varying of microstrip transmission line open stub parameter Xinµ in equation (3) and the transformer turn ratio n in equations (2) and (3), the Port 2 impedance can be compensated at Port 1 in a wide range of impedances and instantaneous RF bandwidths. That is, the input reflection coefficient, Γ in (equation 4), can be controlled by varying the microstrip transmission line stub capacitance, Coµ. Thus, by changing the microstrip transmission line stub capacitance, Coµ, Rs (equation 1), Xs (equation 2), Xµ (equation 3), and the transformer turn ratio n (equation 5) can be controlled. Although both microstrip transmission line open stubs 344, 346 may be identical (e.g., have identical electrical and/or physical characteristics), it should be understood that the microstrip transmission line open stubs 344, 346 need not be identical, in some embodiments.

FIG. 4 depicts an embodiment of a controllable capacitor circuit 438 for either or both circuits 238, 239 in FIG. 2. The controllable capacitor circuit 438 includes a control interface 470, a variable capacitor 474, an RF ground interface 476 (RFGND), and an RF interface 478. In the example of FIG. 4, the control interface receives a control signal (e.g., from monitoring and control system 114, FIG. 1), and the magnitude of the capacitance value of the variable capacitor 474 can be controlled in response to the control signal. In an embodiment, the RF interface 478 of the controllable capacitor circuit 438 is a conductive element that is physically and electrically connected to the open stub of one of the microstrip transmission lines, e.g., coupled to the end of one of lines 330, 332 with conductive material such as conductive solder that physically bonds and galvanically connects the open stub of the microstrip transmission line to the RF interface of the controllable capacitor circuit. The ground interface 476 may be physically and electrically connected to a ground reference voltage (e.g., system ground).

The variable capacitor 474 in the controllable capacitance circuit 238 may take many forms. In some examples, the variable capacitor 474 may include switch-based tunable capacitors, microelectromechanical systems (MEMs)-based tunable capacitors, and varactors. Switch-based tunable capacitors consist of an array of parallel- and/or serial-coupled capacitors (typically binary weighted) connected by an array of switches which are used to switch in and out individual capacitors to vary a net capacitance. Which capacitors of the array are switched in and out may be based on a digital value indicated by the control signal at the control interface 470. Switches could be any type including based on gallium-arsenide (GaAs) field effect transistors (FET) and silicon on insulator (SOI) technology. In the mechanism of MEMS tunable capacitors, an electrostatic force actuates a beam in a MEMS tunable capacitor. When the beam is down, only dielectric separates it from a metal trace below it and the capacitor is on (i.e., connected between the RF interface 478 and the RF ground interface 476). When the beam is up, an additional air gap separates the beam from the metal trace and the capacitor is off (i.e., not connected between the RF interface 478 and the RF ground interface 476). The varactor is a diode designed to be used as a voltage controlled capacitor.

In other example, the variable capacitor 474 may take the form of a barium strontium titanate (BST) capacitor. The BST capacitor may be formed by combining Barium Titanate $BaTiO_3$ with Strontium Titanate $SrTiO_3$ to form a BST thin film and placing the BST thin film in a parallel plate structure, among other methods. The BST thin film is a dielectric material which changes its dielectric constant with an applied electric field such as bias voltage applied to the dielectric material to form a tunable capacitor. The bias voltage may be based on an analog value indicated by the control signal at the control interface 470. In examples, the BST capacitor 474 is based on a multi-layer capacitor thin-film technology formed by a mesa-type process. For example, alternating layers of platinum and BST are deposited on a silicon or alumina substrate to form a four-layer capacitor stack. BST films are deposited by metal-organic decomposition (MOD) or RF reactive sputtering. The BST based capacitor 474 is defined by patterning each layer in sequence from the top down, until the entire mesa structure is defined.

Figure 5B:
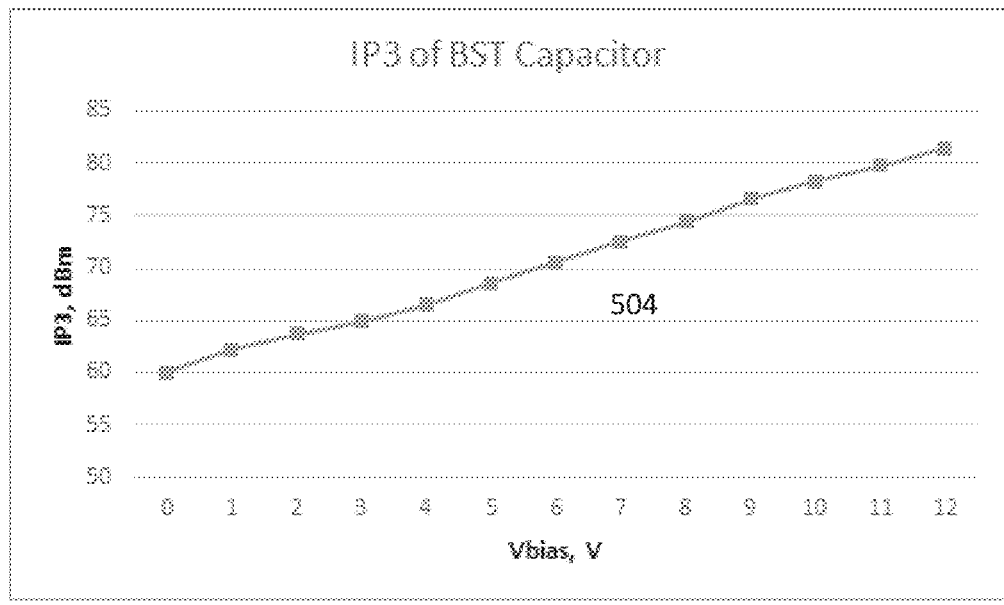
Figure 5C:
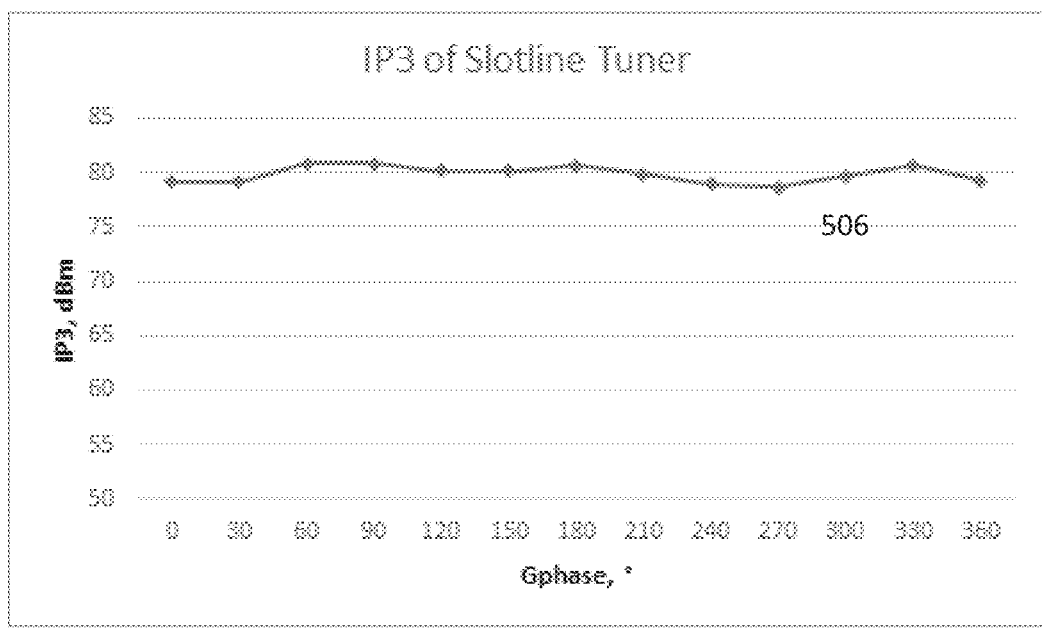

FIG. 5A-C illustrate that use of the BST capacitor in the impedance compensation system 120 results in a linearity of the impedance compensation system 120. The linearity of the impedance compensation system 120 is based on a relationship between capacitance of the BST capacitor and bias voltage and a linearity of the BST capacitor.

FIG. 5A illustrates a curve 502 of capacitance versus bias voltage of the BST capacitor. The curve 502 for the BST capacitor is steep for low bias voltages (e.g., 0-3 volts) indicating a large change in capacitance as a function of small change in bias voltage but shallow for high bias voltages indicating a small change in capacitance as a function of a large change in bias voltage.

FIG. 5B illustrates a curve 504 of linearity of the BST capacitor versus the bias voltage of the BST capacitor. A third order intercept (IP3) term may characterize the linearity where a higher value indicates better linearity which is generally more desirable. As the bias voltage increases, the linearity of the BST capacitor improves and the BST capacitor has a lower capacitance value.

FIG. 5C illustrates a curve 506 of linearity of the impedance compensation system 120 as a function of function of load phase of an RF signal, specifically reflection phase of the Tx signal at a port into the antenna 122. In the RF front-end 100, voltage of an RF signal also modulates the bias voltage applied to the BST capacitor and creates an undesired non-linearity (distortion) such as a parasitic capacitance. When the voltage of the RF signal is low, the impedance compensation system 120 inherently has high linearity because of the nature of the microstrip and slotline structure and when the voltage of the RF signal is high, the BST capacitor has a high linearity resulting in high linearity of the impedance compensation system 120 over reflection phase. The maximum RF voltage occurs at a reflection phase when the BST capacitor is set to a low capacitance resulting in a substantially flat linearity over reflection phase which in some examples is close to a maximum linearity of the BST capacitor. Impedance compensation systems implemented with 7C and T-structures that are based on sections of variable reactance connected to a transmission line of the RF front-end 100 may not have a flat linearity.

In an embodiment, the controllable capacitor circuit 438 may be a discretely-packaged semiconductor device (e.g., with a physical size on the order of 1-1.5 mm×1-1.5 mm and 0.4-0.5 mm thick) that is surface mounted to the PCB. In an example embodiment, the variable capacitor 474 may have an adjustable capacitance in the range of 0.5-1.6 picofarads (pF) and a quality factor (Q) of about 400 at about 700 MHz. In alternate embodiments, the variable capacitor 474 may have a wider, narrower, and/or different range of capacitance, and/or higher or lower Q.

Figure 6:
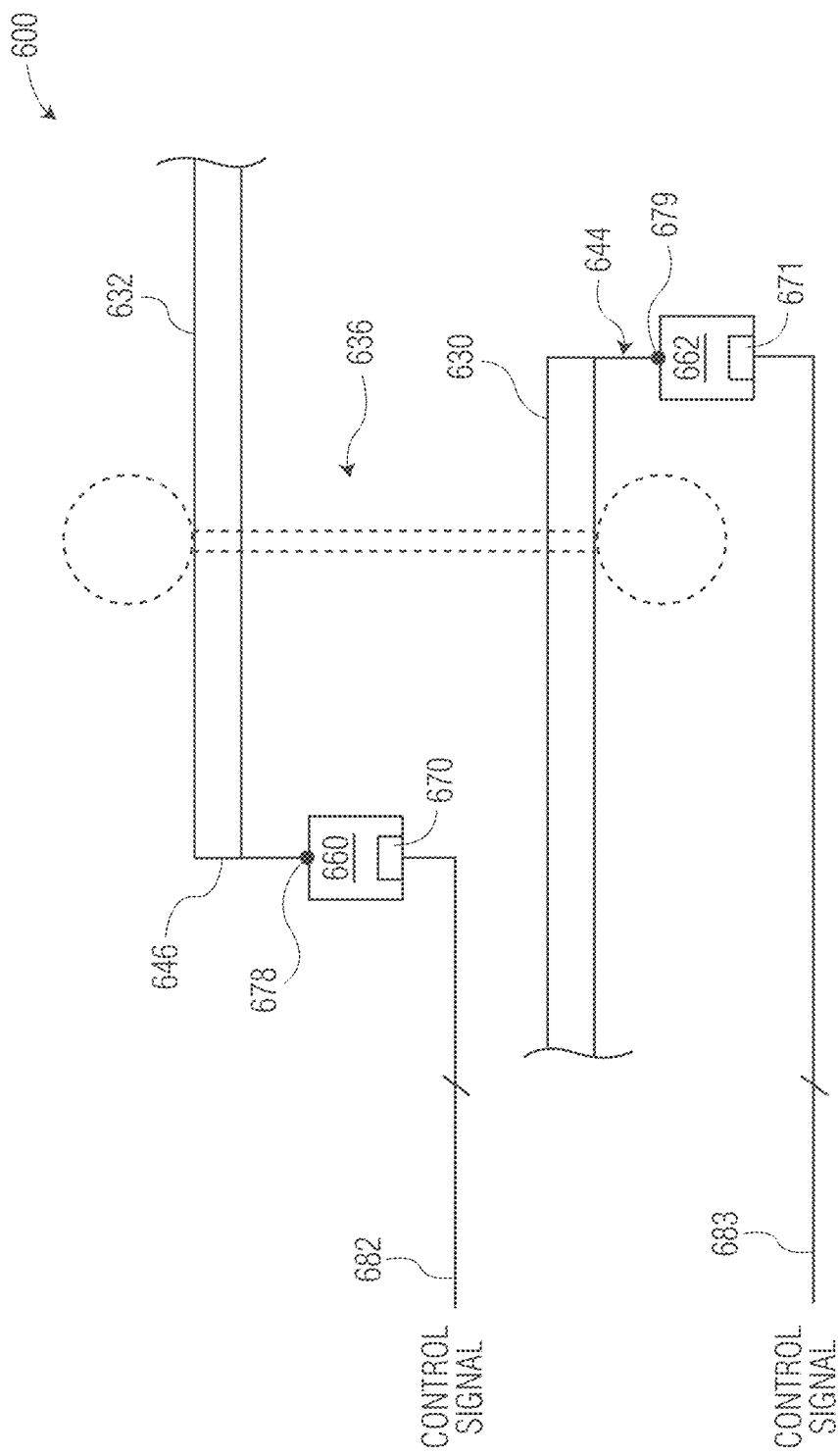
FIG. 6 depicts a circuit of the impedance compensation system that can be used in the RF front-end of FIG. 1 to provide compensation for impedance mismatch.

FIG. 6 depicts a circuit of the impedance compensation system 600 that can be used in the RF front-end of FIG. 1 to provide compensation for the mismatch between the impedance of the antenna element 122 and impedance of other RF components of the RF front-end 100. In the embodiment of FIG. 6, the system 600, referred to as an "impedance compensation system," includes a first microstrip transmission line 630, a second microstrip transmission line 632, a slotline formation 636, and one or more controllable capacitance circuits 660, 662 similar to the circuit described with reference to FIGS. 2-4. In the example of FIG. 6, each controllable capacitance circuit 660, 662 includes a variable capacitor which is electrically connected to one of the open stubs 644 and 646 of the first and second microstrip transmission lines 630 and 632 at the respective RF interface 678, 679. The control interface 670, 671 of the controllable capacitor circuit 660, 662 is connected to a distinct control signal line 682, 683 through which capacitance control signals can travel. In operation, the capacitances at the open stubs of the microstrip transmission lines 630, 632 are controlled in response to the digital capacitance control signals to compensate for impedance mismatch. For example, the capacitances of the variable capacitor are independently controlled and/or adjusted in response to the capacitance control signals that are, for example, received from a monitoring and control system 114 of the RF front-end 100. In an embodiment, the digital capacitance control signals include transition-specific controls signals that are used to independently control the first controllable capacitor circuit 662 connected to the first microstrip transmission line-to-slotline formation transition and the second controllable capacitor circuit 660 connected to the second microstrip transmission line-to-slotline formation transition. At any given time, the controllable capacitor circuit 660, 662 may be controlled to have substantially the same capacitance value, or different capacitance values.

Figure 7A:
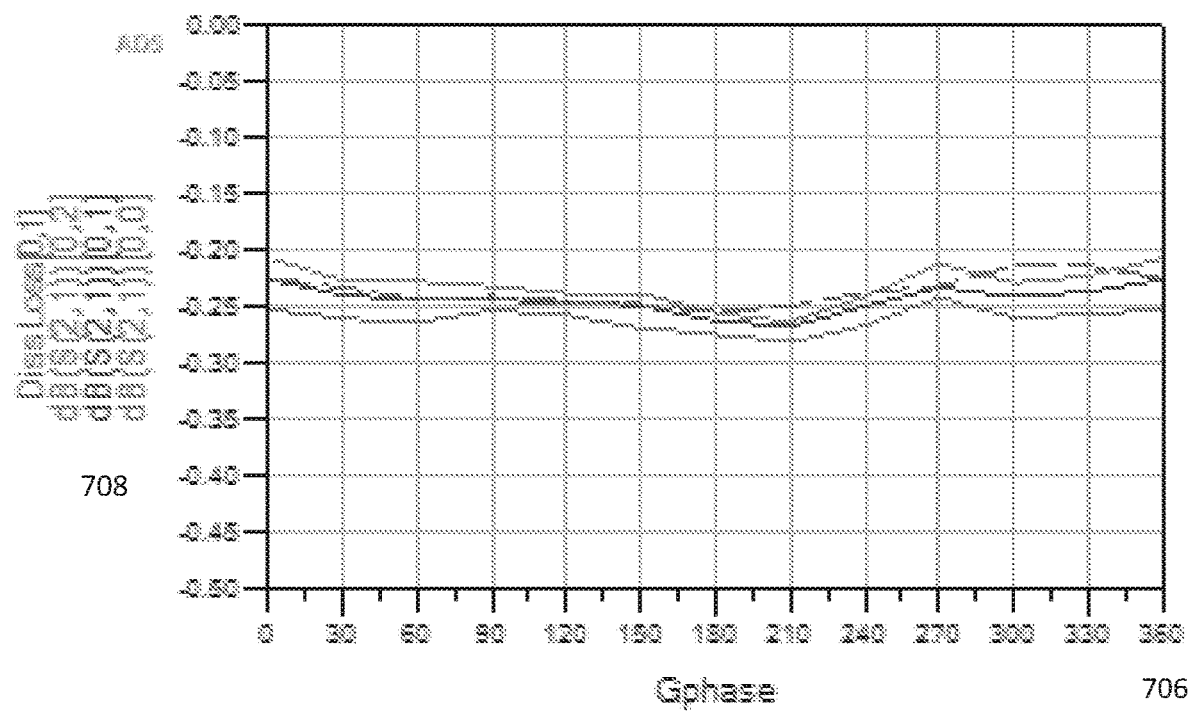
FIGS. 7A to 7C illustrates various graphs of performance of the impedance compensation system.
Figure 7B:
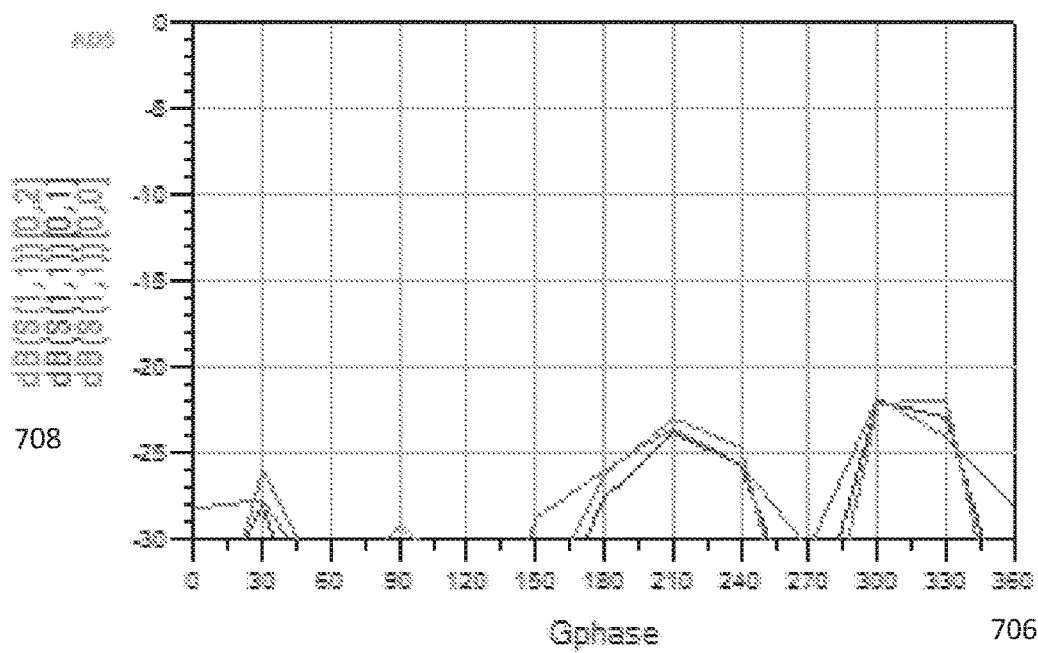
Figure 7C:
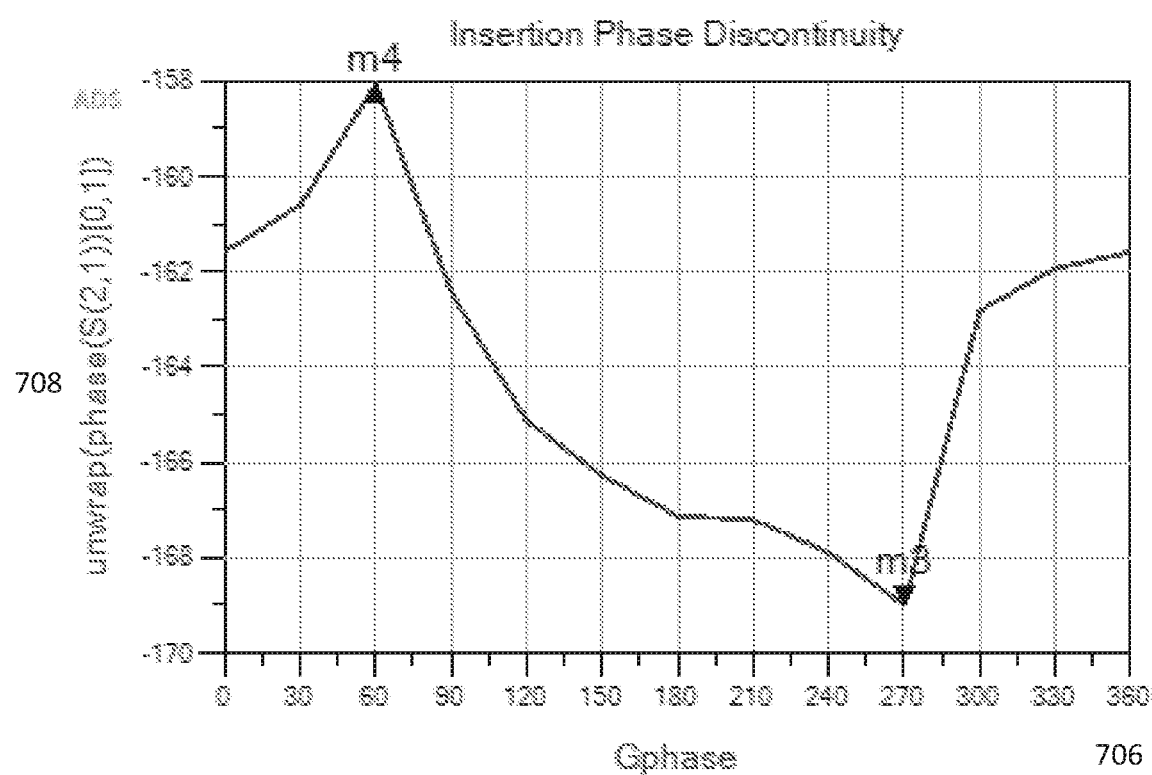

FIGS. 7A-C illustrates various graphs of performance of the impedance compensation system.

Insertion loss (IL) is measure of loss of RF signal power resulting from the insertion of the impedance compensation system 702 in the RF front-end 100 and return loss (RL) is a loss of RF signal power resulting from signal reflection by the impedance compensation system 702 in the RF front-end 100. FIG. 7A is curve of insertion loss (IL) of the Tx signal as a function of reflection phase, specifically reflection phase of the Tx signal at a port into the antenna 122. FIG. 7B is a curve of return loss (RL) of the Tx signal as a function of reflection phase, specifically reflection phase of the Tx signal at a port into the antenna 122. The IL and RL in decibels (dB) is shown on a vertical axis 708 and the reflection phase in degrees over 360° is shown on a horizontal axis 706 for three radio frequencies, 2.5 GHz, 2.6 GHz, and 2.7 GHz associated with the RF front-end 100. Insertion loss of about −0.20 to −0.25 dB and return loss below −20 dB as a function of reflection phase indicates that the insertion loss and return loss are low as a function of phase for the described impedance compensation system 120.

Insertion phase (IP) is a change in phase of the RF signal by the impedance compensation system 120 as a function of reflection phase. FIG. 7C is a curve of the IP of the Tx signal as a function of reflection phase, specifically reflection phase of the Tx signal at a port into the antenna 122. The IP is shown on the vertical axis 708 and the reflection phase is shown on the horizontal axis 706. FIG. 7C shows that the insertion phase variation is less than 11 degrees from peak m4 to trough m5 over a tuning phase range using the impedance compensation system 120 disclosed herein. The insertion phase variation of less than 11 degrees over the tuning phase range indicates that the insertion phase variation is low over the tuning phase range for the described impedance compensation system 120.

Figure 8A:
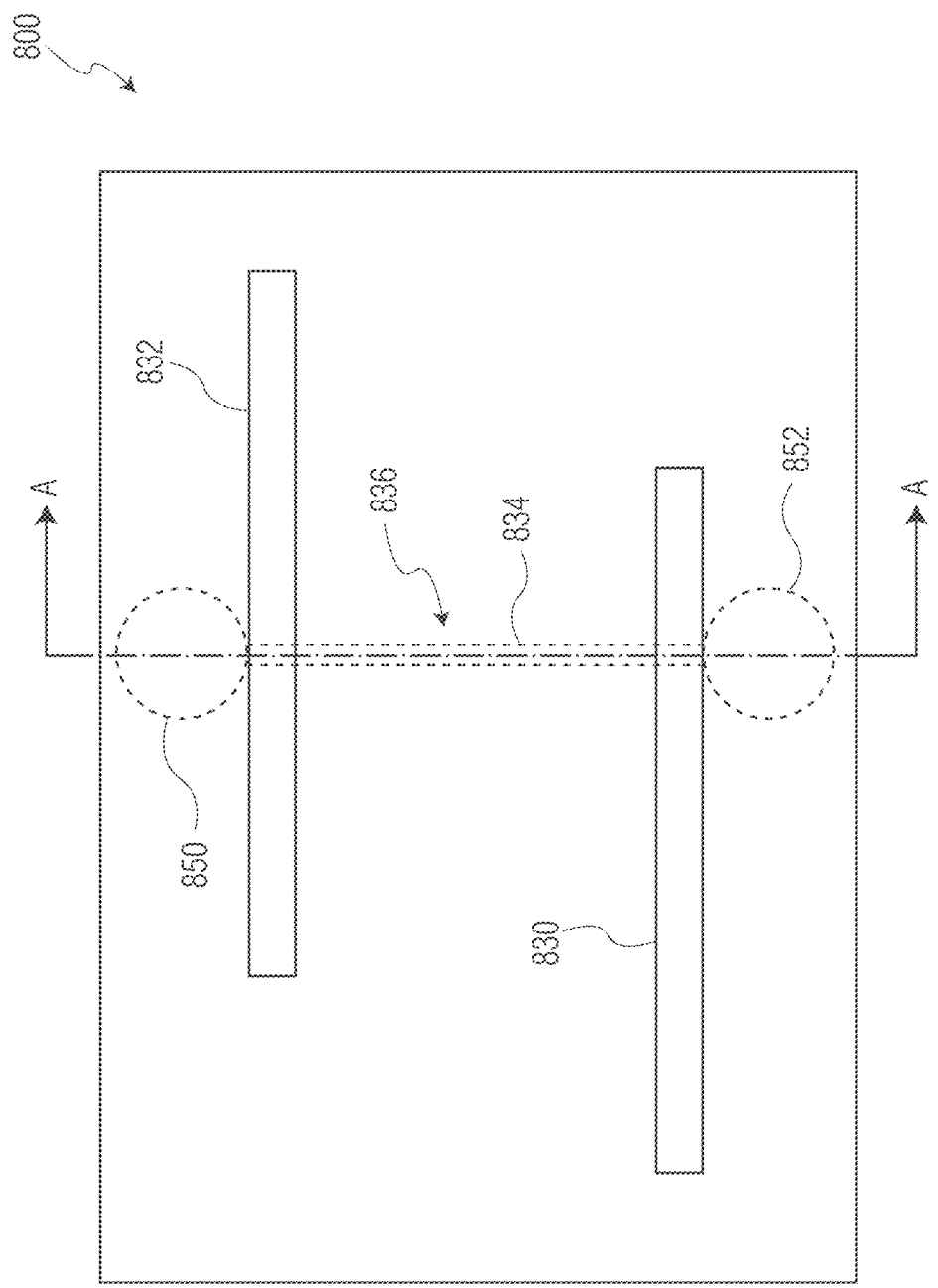
FIG. 8A is an overhead view of an example layout of a component that includes a first microstrip transmission line, a second microstrip transmission line, and a slotline formation.
Figure 8B:
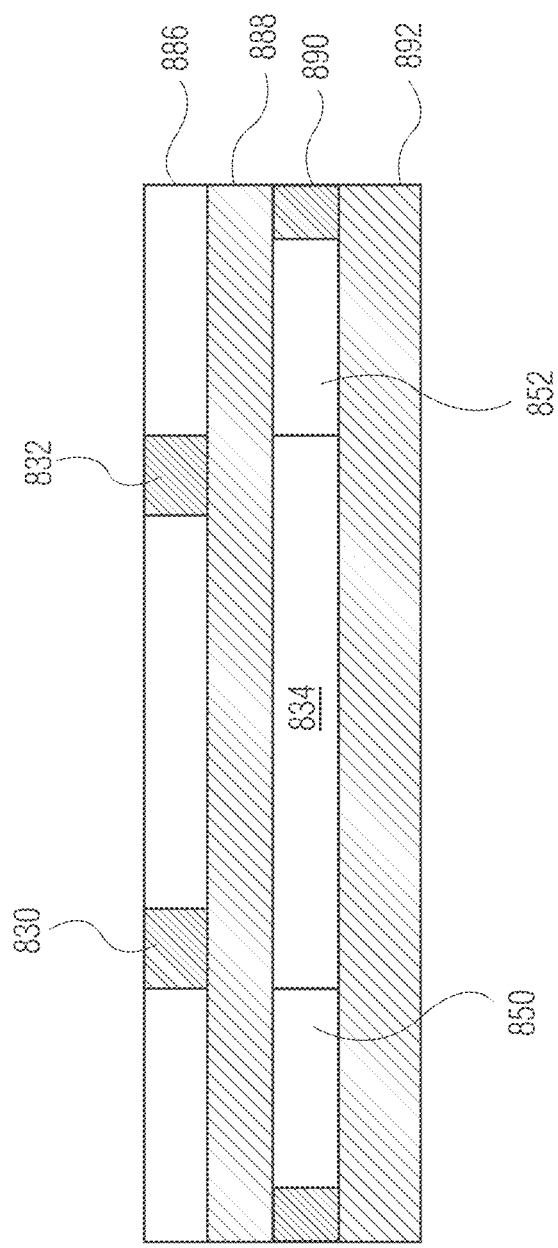
FIG. 8B is a side cutaway view of the component of FIG. 8A at cross section A-A.

FIG. 8A is an overhead view of an example layout of a component 800 that includes a first microstrip transmission line 830 (e.g., microstrip transmission line 230), a second microstrip transmission line 832 (e.g., microstrip transmission line 232), and a slotline formation 836 (e.g., slotline formation 236) as described above relative to a footprint of the component. FIG. 8B is a side cutaway view of the component of FIG. 8A at cross section A-A.

In the example of FIGS. 8A and 8B, the first and second microstrip transmission lines 830 and 832 are coplanar. For example, the first and second microstrip transmission lines 830 and 832 may be two conductive features of a first patterned conductive layer of a substrate (e.g., a PCB). As another example, the features of the slotline formation 836 may include the shorted stubs 850, 852 and an elongated linear portion 834 that connects the shorted stubs. From top to bottom, the cross-section of FIG. 8B shows that the PCB (or other substrate) includes a first patterned conductive layer 886 (that corresponds to the first and second microstrip transmission lines 830, 832 separated by a dielectric in some examples), a dielectric layer 888, a second patterned conductive layer 890 (that corresponds to the slotline formation

836 with conductive features at ends of the layer 890 shown and a dielectric or air gap corresponding to 834, 850, 852 in some examples), and a bottom dielectric layer 892. With reference to FIG. 8A, in an example embodiment, the component 800 is approximately 10 millimeters (mm)×6 mm and the microstrip transmission lines 830, 832 have a width of about 0.25 mm and a total length of about 15 mm, the elongated portion 834 of the slotline formation 836 has a width in the range of about 0.25-0.3 mm and a length in the range of about 2.5-3 mm, and the shorted stubs 850, 852 of the slotline formation 836 have a diameter of about 3.5 mm. In other embodiments, the actual or relative dimensions listed in the previous sentence may be smaller and/or larger. With reference to FIG. 8B, in an embodiment, the microstrip layer 886 is approximately 25 micrometers thick (vertical dimension), the dielectric layer 888 is approximately 75 micrometers thick, the conductive layer 890 in which the slotline formation is approximately 20 micrometers thick, and the bottom dielectric layer 892 is approximately 200 micrometers thick with Dielectric Constant about $\varepsilon_r$=3.3. In other embodiments, the actual or relative dimensions or values listed in the previous sentence may be smaller and/or larger. Although FIGS. 8A and 8B depict a component 800 with certain footprint dimensions, in some other embodiments, the first and second microstrip transmission lines, the slotline formation, and the controllable capacitance circuit are integrated into a substrate (such as a PCB) that includes other components, for example, components of a RF front-end. In other words, component 800 may be a discrete component formed on a distinct substrate, or component 800 may be integrally formed in a PCB with other portions of an RF front-end.

As described above, employing a microstrip-to-slotline transition and a slotline-to-microstrip transition with controllable capacitance such as BST capacitance electrically connected to at least one of the microstrip transmission lines enables dynamic impedance compensation to be implemented with compact components in a manner that provides a wide dynamic range of adjustability over a wide frequency range. Some benefits of such an arrangement and technique may include reduced insertion phase variation over RF frequencies, wide range of impedance compensation over RF frequencies and over tuning range, high linearity, wide range of impedance compensation over RF frequencies, filtering shape frequency response where insertion loss at frequencies from 0 to 1.5 GHz varies from −40 dB to −10 dB but at operating frequencies from 1.5 GHz to 10 GHz is about −0.1 to −0.2 dB, compactness of the impedance compensation system, RF power transfer from a power amplifier side substrate to an antenna side substrate, galvanic isolation of the RF front-end from the antenna, smooth insertion phase variation over RF frequencies, and higher output power.

Although the conductive layers of the microstrip transmission lines and the conductive layer in which the slotline formation is formed are described as being separated by a dielectric layer, or dielectric layers, the microstrip transmission lines and the slotline formation alternatively may be separated from each other by open space that is filled with a gas, such as air. In an embodiment, an impedance compensation system implemented as described with reference to FIGS. 1-8 could be realized on a two-layer PCB or a multilayer PCB, or on any other substrate capable of operating at an RF frequency tuning range of, for example, 800 MHz-6 GHz, not excluding lower or higher frequencies. Example performance parameters for a 5G wireless application may include: operation frequencies—band 42 (3.4-3.6 GHz); signal bandwidth—200 MHz; output power average—5 Watts; and load mismatch—14 dB return loss (RL). Performance parameters may be in different ranges and/or may be lower or higher, as well.

As already discussed above, the present disclosure is intended to encompass numerous embodiments in addition to those described herein in relation to any of FIGS. 1-8. For example, it is envisioned that numerous different embodiments can employ any of a variety of different types of slotline formations having any of a variety of configurations, sizes, and shapes, including end gap portions of different sizes and shapes. Although the several embodiments described above employ PCBs in which slotline formations are formed and multiple microstrip transmission lines are provided at layer(s) or level(s) above or below the slotline formations, the description of the microstrip transmission lines as being above or below the slotline formations is merely for convenience, and the microstrip transmission lines can also in other embodiments be positioned to the sides of the slotline formations, or be arranged in other different manners relative to the conductive layer in which the slotline formations are provided.

Figure 9:
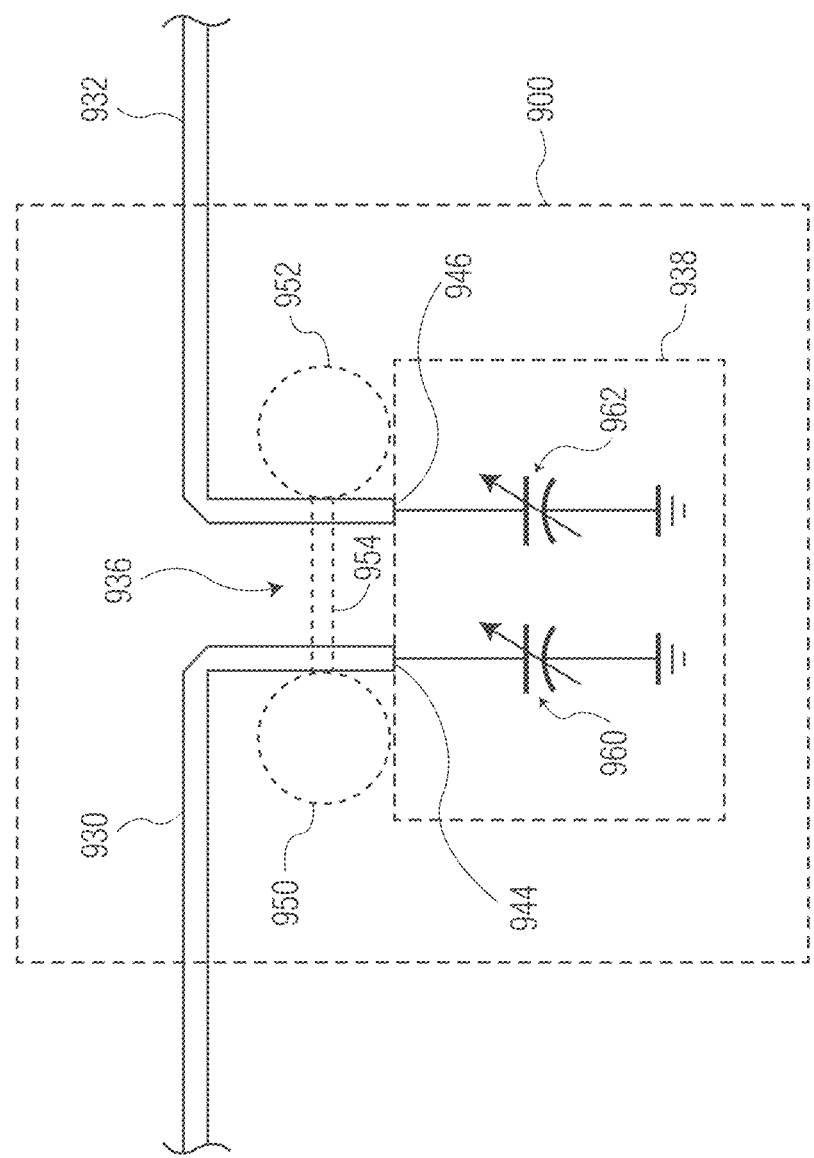
FIG. 9 depicts an alternative circuit of the impedance compensation system that can be used in the RF front-end of FIG. 1 to provide compensation for impedance mismatch.

FIG. 9 depicts an alternative circuit of the impedance compensation system that can be used in the RF front-end of FIG. 1 to provide compensation for impedance mismatch. In the embodiment of FIG. 9, the system 900 includes a first microstrip transmission line 930 formed with a ninety degree bend, a second microstrip transmission line 932 formed with a ninety degree bend, a slotline formation 936 having shorted stubs 950, 952 and an elongated linear portion 954, and one or more controllable capacitance circuits 960, 962 similar to the circuit described with reference to FIGS. 2-4. In the example of FIG. 9, the controllable capacitance circuit 960, 962 each include a variable capacitor which is electrically connected to one of the open stubs 944 and 946 of the first and second microstrip transmission lines 930 and 932. In an embodiment, the variable capacitor may include switch-based tunable capacitors, microelectromechanical systems (MEMs)-based tunable capacitors, varactors, or BST capacitors. In operation, the capacitances at the open stubs of the microstrip transmission lines are controlled in response to digital capacitance control signals to compensate for impedance mismatch. For example, the capacitance values of the variable capacitors are independently controlled and/or adjusted in response to the digital capacitance control signals that are, for example, received from a monitoring and control system 114 of an RF front-end 100 (see FIG. 1). In an embodiment, the digital capacitance control signals include transition-specific controls signals that are used to independently control the first controllable capacitor circuit 960 connected to the first microstrip transmission line-to-slotline formation transition and the second controllable capacitor circuit 962 connected to the second microstrip transmission line-to-slotline formation transition. At any given time, the controllable capacitor circuit 960, 962 may be controlled to have substantially the same capacitance value, or different capacitance values.

Also, as should be evident from FIGS. 1-9, the present disclosure is intended to encompass a variety of different embodiments and arrangements having any arbitrary number of layers, and/or having any of a variety of different types of input or output structures or components. For example, as already discussed above, in some embodiments a two-layer PCB is employed in which first and second patterned conductive layers are separated by a dielectric layer, one or more microstrip transmission lines are formed from portions of one of the conductive layers, and a slotline formation is formed from a removed portion of (or gap in) the other conductive layer. Also for example, in other embodiments, a multi-layer PCB having more than two conductive layers with dielectric layers positioned therebetween (e.g., a PCB with first, second, and third conductive layers, a first dielectric layer positioned between the first and second conductive layers, and a second dielectric layer positioned between the second and third conductive layers) can be employed. In such embodiments, a slotline formation can be provided in any one of the conductive layers (or possibly multiple slotline formations can be provided in one or more of the conductive layers). Further, for example, it should be appreciated that, depending upon the embodiment, any of the embodiments of FIGS. 1-9 can be implemented (or modified to be implemented) on either a two-layer PCB or a multi-layer PCB. Further still, it should be appreciated that, depending upon the embodiment, any of the embodiments of FIGS. 1-9 can be implemented (or modified to be implemented) in substrates other than PCB-type substrates, such as multi-layer ceramic substrates (e.g., co-fired ceramic substrates), semiconductor material substrates, and so on.

Figure 10:
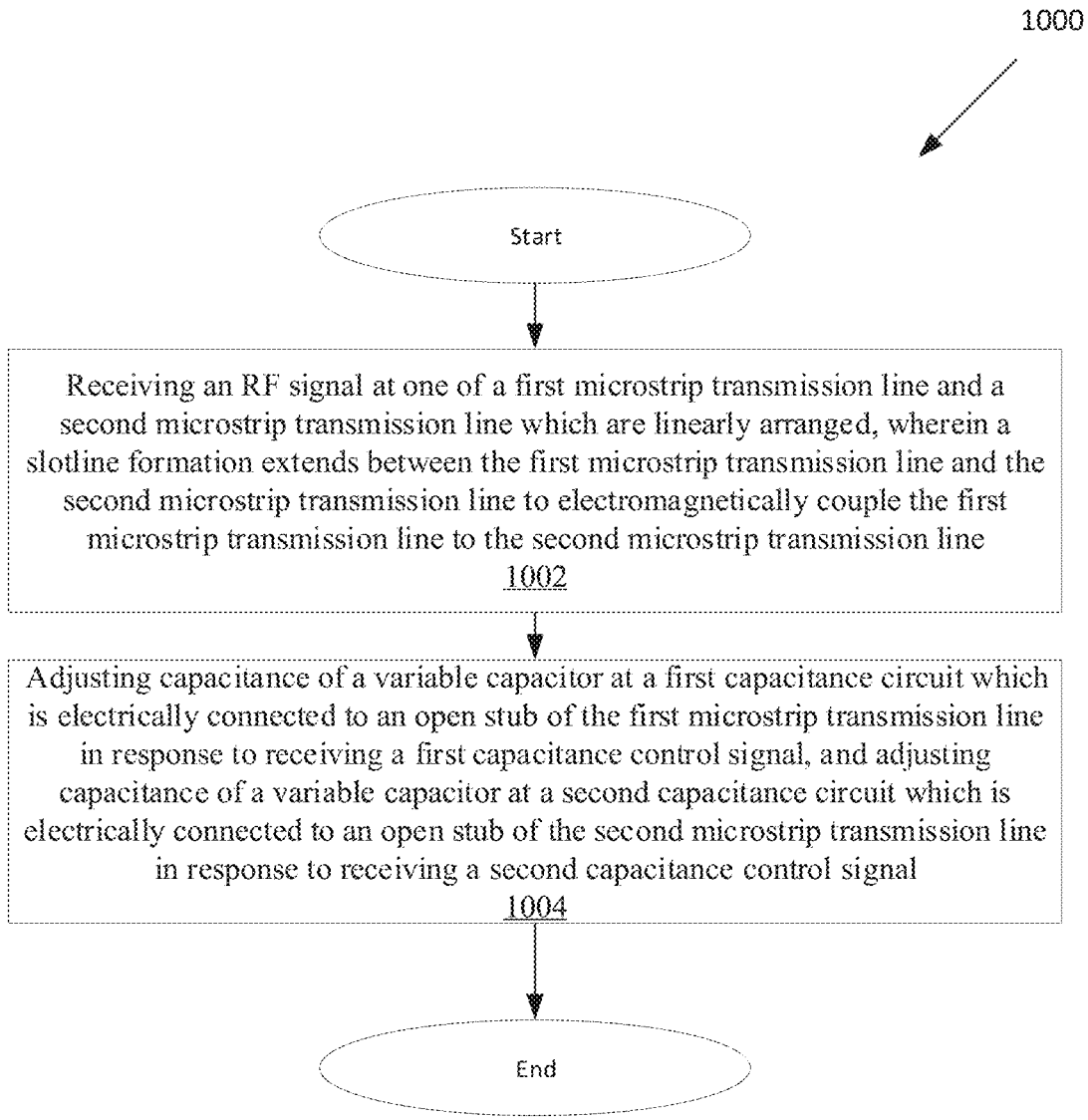
FIG. 10 is a flow diagram of a method for providing impedance compensation for the RF front-end.

FIG. 10 is a flow diagram 1000 of a method for providing impedance compensation for an RF front-end. According to the method, at block 1002, an RF signal is received at one of a first microstrip transmission line and a second microstrip transmission line which are linearly arranged strips, wherein a slotline formation extends between the first microstrip transmission line and the second microstrip transmission line to electromagnetically couple the first microstrip transmission line to the second microstrip transmission line. At block 1004, capacitance at an open stub of at least one of the first microstrip transmission line and the second microstrip transmission line is adjusted to provide impedance compensation by adjusting capacitance of a variable capacitor (e.g., BST capacitor) at a first capacitance circuit 238 which is electrically connected to an open stub of the first microstrip transmission line in response to receiving a first capacitance control signal, and adjusting capacitance of a variable capacitor (e.g., BST capacitor) at a second capacitance circuit which is electrically connected to an open stub of the second microstrip transmission line in response to receiving a second capacitance control signal.

In one embodiment, a circuit is disclosed. The circuit comprises: a first microstrip transmission line; a second microstrip transmission line; wherein the first microstrip transmission line and the second microstrip transmission line include linearly arranged conductive strips on at least one conductive layer of the circuit; a slotline formation; wherein the slotline formation extends between the first micro strip transmission line and the second microstrip transmission line, the slotline formation configured to electromagnetically couple the first microstrip transmission line to the second microstrip transmission line during operation of the circuit; and at least one controllable capacitance circuit electrically connected to at least one of the first microstrip transmission line and the second microstrip transmission line, wherein a magnitude of a capacitance value of the at least one controllable capacitance circuit determines an impedance of the circuit. In an embodiment, the at least one controllable capacitance circuit comprises: a first controllable capacitance circuit electrically connected to the first microstrip transmission line and including a first control interface, wherein a magnitude of a capacitance value of the first controllable capacitance circuit is controllable in response to a first capacitance control signal received at the first control interface; and second controllable capacitance circuit electrically connected to the second microstrip transmission line and including a second control interface, wherein a magnitude of a capacitance value of the second controllable capacitance circuit is controllable in response to a second capacitance control signal received at the second control interface. In an embodiment, a first end of the first microstrip transmission line is coupled to a first controllable capacitance circuit and a second end of the first microstrip transmission line is coupled to a bandpass filter; and wherein a first end of the second microstrip line is coupled to a second controllable capacitance circuit and a second end of the second microstrip line is coupled to an antenna. In an embodiment, the intersecting portions of the first microstrip transmission line and the slotline formation are separated by a dielectric layer, and wherein the intersecting portions of the second microstrip transmission line and the slotline formation are separated by the dielectric layer. In an embodiment, the slotline formation is formed as a gap in a conductive layer of the PCB. In an embodiment, the first microstrip transmission line and the second microstrip transmission line are parallel to each other. In an embodiment, the magnitude of the capacitance varies inversely to a capacitance control signal received at a control interface of the at least one controllable capacitance circuit. In an embodiment, each of the at least one controllable capacitance circuit includes a barium strontium titanate (BST) capacitor. In an embodiment, a linearity of the circuit is substantially flat as a function of load phase. In an embodiment, a linearity of a capacitor of the at least one controllable capacitance circuit increases as a function of a bias voltage which controls the capacitance value of the capacitor. In an embodiment, a linearity of the circuit is substantially the same as a linearity of a capacitor of the at least one controllable capacitance circuit at a maximum voltage of a radio frequency (RF) signal in the circuit. In an embodiment, an RF front-end comprises the circuit.

In another embodiment, a system is disclosed. The system comprises: a first microstrip transmission line; a second microstrip transmission line; wherein the first microstrip transmission line and the second microstrip transmission line form portions of a conductive layer of a printed circuit board; a slotline formation, wherein the slotline formation extends between the first microstrip transmission line and the second microstrip transmission line to electromagnetically couple the first microstrip transmission line to the second microstrip transmission line; and at least one controllable capacitance circuit electrically connected to at least one of the first microstrip transmission line and the second microstrip transmission line and including a control interface, wherein a magnitude of a capacitance value of a barium strontium titanate (BST) capacitor of the at least one controllable capacitance circuit is controllable in response to a capacitance control signal received at the control interface, wherein a magnitude of capacitance value of the at least one controllable capacitance circuit determines an impedance of the system. In an embodiment, the at least one controllable capacitance circuit comprises: a first controllable capacitance circuit electrically connected to the first microstrip transmission line and including a first control interface wherein a magnitude of a capacitance value of the first controllable capacitance circuit is controllable in response to a first capacitance control signal received at the first control interface; and a second controllable capacitance circuit electrically connected to the second microstrip transmission line and including a second control interface, wherein a magnitude of a capacitance value of the second controllable capacitance circuit is controllable in response to a second capacitance control signal received at the second control interface.

In yet another embodiment, a method is disclosed. The method provides impedance compensation for a radio frequency (RF) front-end, the method comprising: receiving an RF signal at one of a first microstrip transmission line and a second microstrip transmission line, wherein a slotline formation extends between the first microstrip transmission line and the second microstrip transmission line to form a circuit which electromagnetically couples the first microstrip transmission line to the second microstrip transmission line, and wherein the first microstrip transmission line and the second microstrip transmission line are arranged linearly and formed from portions of a conductive layer of a printed circuit board; and adjusting a capacitance value of a variable capacitor at an open stub of at least one of the first microstrip transmission line and the second microstrip transmission line to provide the impedance compensation. In an embodiment, the variable capacitor includes a barium strontium titanate (BST) capacitor. In an embodiment, a magnitude of the capacitance value varies inversely to a capacitance control signal received at a control interface of at least one controllable capacitance circuit. In an embodiment, a linearity of the circuit is substantially flat as a function of load phase. In an embodiment, a linearity of the variable capacitor increases as a function of a bias voltage which controls a capacitance value of the capacitor. In an embodiment, a linearity of the circuit is substantially the same as a linearity of the variable capacitor at a maximum voltage of an RF signal in the circuit.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program. The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A circuit comprising:
a first microstrip transmission line;
a second microstrip transmission line;
wherein the first microstrip transmission line and the second microstrip transmission line include linearly arranged conductive strips on at least one conductive layer of the circuit;
a slotline formation;
wherein the slotline formation extends between the first microstrip transmission line and the second microstrip transmission line, the slotline formation configured to electromagnetically couple the first microstrip transmission line to the second microstrip transmission line during operation of the circuit; and
at least one controllable capacitance circuit electrically connected to at least one of the first microstrip transmission line and the second microstrip transmission line, wherein a magnitude of a capacitance value of the at least one controllable capacitance circuit determines an impedance of the circuit;
wherein the at least one controllable capacitance circuit comprises:
a first controllable capacitance circuit electrically connected to the first microstrip transmission line and including a first control interface, wherein a magnitude of a capacitance value of the first controllable capacitance circuit is controllable in response to a first capacitance control signal received at the first control interface; and
a second controllable capacitance circuit electrically connected to the second microstrip transmission line and including a second control interface, wherein a magnitude of a capacitance value of the second controllable capacitance circuit is controllable in response to a second capacitance control signal received at the second control interface.

2. The circuit of claim 1, wherein a first end of the first microstrip transmission line is coupled to a first controllable capacitance circuit and a second end of the first microstrip transmission line is coupled to a bandpass filter; and wherein a first end of the second microstrip line is coupled to a second controllable capacitance circuit and a second end of the second microstrip line is coupled to an antenna.

3. The circuit of claim 1, wherein the intersecting portions of the first microstrip transmission line and the slotline formation are separated by a dielectric layer, and wherein the intersecting portions of the second microstrip transmission line and the slotline formation are separated by the dielectric layer.

4. The circuit of claim 1, wherein the slotline formation is formed as a gap in a conductive layer of the printed circuit board.

5. The circuit of claim 1, wherein the first microstrip transmission line and the second microstrip transmission line are parallel to each other.

6. The circuit of claim 1, wherein the magnitude of the capacitance varies inversely to a capacitance control signal received at a control interface of the at least one controllable capacitance circuit.

7. The circuit of claim 1, wherein each of the at least one controllable capacitance circuit includes a barium strontium titanate (BST) capacitor.

8. The circuit of claim 1, wherein a linearity of the circuit is substantially flat as a function of load phase.

9. The circuit of claim 1, wherein a linearity of a capacitor of the at least one controllable capacitance circuit increases as a function of a bias voltage which controls the capacitance value of the capacitor.

10. The circuit of claim 1, wherein a linearity of the circuit is substantially the same as a linearity of a capacitor of the at least one controllable capacitance circuit at a maximum voltage of a radio frequency (RF) signal in the circuit.

11. An RF front-end comprising the circuit of claim 1.

12. A system comprising:
a first microstrip transmission line;
a second microstrip transmission line;
wherein the first microstrip transmission line and the second microstrip transmission line form portions of a conductive layer of a printed circuit board;
a slotline formation,
wherein the slotline formation extends between the first microstrip transmission line and the second microstrip transmission line to electromagnetically couple the first microstrip transmission line to the second microstrip transmission line; and
at least one controllable capacitance circuit electrically connected to at least one of the first microstrip transmission line and the second microstrip transmission line and including a control interface, wherein a magnitude of a capacitance value of a barium strontium titanate (BST) capacitor of the at least one controllable capacitance circuit is controllable in response to a capacitance control signal received at the control interface, wherein a magnitude of capacitance value of the at least one controllable capacitance circuit determines an impedance of the system;
wherein the at least one controllable capacitance circuit comprises:
a first controllable capacitance circuit electrically connected to the first microstrip transmission line and including a first control interface wherein a magnitude of a capacitance value of the first controllable capacitance circuit is controllable in response to a first capacitance control signal received at the first control interface; and
a second controllable capacitance circuit electrically connected to the second microstrip transmission line and including a second control interface, wherein a magnitude of a capacitance value of the second controllable capacitance circuit is controllable in response to a second capacitance control signal received at the second control interface.

13. A method for providing impedance compensation for a radio frequency (RF) front-end, the method comprising:
receiving an RF signal at one of a first microstrip transmission line and a second microstrip transmission line, wherein a slotline formation extends between the first microstrip transmission line and the second microstrip transmission line to form a circuit which electromagnetically couples the first microstrip transmission line to the second microstrip transmission line, and wherein the first microstrip transmission line and the second microstrip transmission line are arranged linearly and formed from portions of a conductive layer of a printed circuit board; and
adjusting a capacitance value of a variable capacitor at an open stub of at least one of the first microstrip transmission line and the second microstrip transmission line to provide the impedance compensation; wherein a linearity of the circuit is substantially flat as a function of load phase.

14. The method of claim 13, wherein the variable capacitor includes a barium strontium titanate (BST) capacitor.

15. The method of claim 13, wherein a magnitude of the capacitance value varies inversely to a capacitance control signal received at a control interface of at least one controllable capacitance circuit.

16. The method of claim 13, wherein a linearity of the variable capacitor increases as a function of a bias voltage which controls a capacitance value of the capacitor.

17. The method of claim 13, wherein a linearity of the circuit is substantially the same as a linearity of the variable capacitor at a maximum voltage of an RF signal in the circuit.

\* \* \* \* \*